(12) United States Patent
Chiu et al.

(10) Patent No.: US 10,112,825 B2
(45) Date of Patent: Oct. 30, 2018

(54) SEMICONDUCTOR STRUCTURE AND MANUFACTURING METHOD FOR THE SAME

(71) Applicant: UNITED MICROELECTRONICS CORP., Hsinchu (TW)

(72) Inventors: Te-Huang Chiu, Hsinchu (TW); Weng-Yi Chen, Zhubei (TW); Kuan-Yu Wang, New Taipei (TW)

(73) Assignee: UNITED MICROELECTRONICS CORP., Hsinchu (TW)

(*) Notice: Subject to any disclaimer, the term of this patent is extended or adjusted under 35 U.S.C. 154(b) by 0 days.

(21) Appl. No.: 15/448,804

(22) Filed: Mar. 3, 2017

(65) Prior Publication Data
US 2018/0208460 A1    Jul. 26, 2018

(30) Foreign Application Priority Data
Jan. 24, 2017 (TW) .............................. 106102636 A

(51) Int. Cl.
B81B 7/00    (2006.01)
B81C 1/00    (2006.01)

(52) U.S. Cl.
CPC ........ *B81C 1/00246* (2013.01); *B81B 7/0006* (2013.01); *B81B 2201/0214* (2013.01); *B81B 2201/0257* (2013.01); *B81B 2203/0127* (2013.01); *B81B 2203/0315* (2013.01); *B81B 2203/0384* (2013.01); *B81B 2203/0392* (2013.01); *B81B 2203/04* (2013.01); *B81C 2201/014* (2013.01); *B81C 2203/0735* (2013.01); *B81C 2203/0771* (2013.01)

(58) Field of Classification Search
CPC .......................... B81B 7/0006; B81C 1/00246
See application file for complete search history.

(56) References Cited

U.S. PATENT DOCUMENTS 7,759,256 B2 * 7/2010 Wang .................. B81C 1/00182
                                                    257/E21.17
8,546,170 B2   10/2013 Traynor et al.
2014/0367805 A1  12/2014 Chen et al.

* cited by examiner

*Primary Examiner* — Mark Prenty
(74) *Attorney, Agent, or Firm* — WPAT, PC

(57) ABSTRACT

A semiconductor structure and a manufacturing method for the same are disclosed. The semiconductor structure includes a MEMS region. The MEMS region includes a sensing membrane and a metal ring. The metal ring defines a cavity under the sensing membrane.

14 Claims, 4 Drawing Sheets tion # SEMICONDUCTOR STRUCTURE AND MANUFACTURING METHOD FOR THE SAME

This application claims the benefit of Taiwan application Serial No. 106102636, filed Jan. 24, 2017, the subject matter of which is incorporated herein by reference.

BACKGROUND

Technical Field

The disclosure relates to a semiconductor structure and a manufacturing method for the same, and more particularly to a semiconductor structure comprising a MEMS and a manufacturing method for the same.

Description of the Related Art

In a semiconductor technology, micro-electro-mechanical systems (MEMS) devices are widely used in a variety of products with smaller sizes, such as micro-acoustical sensor, a gyro-sensor, an accelerometer, a gas sensor, or a clock generation and oscillator. However, a product quality is influenced according to stability and accuracy of a manufacturing process.

SUMMARY

The present disclosure provides a semiconductor structure and a manufacturing method for the same.

According to a concept of the present disclosure, a semiconductor structure is disclosed. The semiconductor structure comprises a micro-electro-mechanical system (MEMS) region. The MEMS region comprises a sensing membrane and a metal ring. The metal ring defines a cavity under the sensing membrane.

According to another concept of the present disclosure, a semiconductor structure is disclosed. The semiconductor structure comprises a substrate, a lower dielectric portion, a metal ring, an upper dielectric portion and a cavity. The lower dielectric portion is on the substrate. The metal ring is on the lower dielectric portion. The upper dielectric portion is on the metal ring. The cavity exposes a sidewall surface of the substrate, a sidewall surface of the lower dielectric portion, a sidewall surface of the metal ring and a sidewall surface of the upper dielectric portion in the MEMS region.

According to yet another concept of the present disclosure, a manufacturing method for a semiconductor structure is disclosed. The manufacturing method comprises the following steps. A dielectric structure is formed on a substrate. A metal ring is formed in a MEMS region. The metal ring is embedded in the dielectric structure. A cavity is formed by a removing method. The removing method comprises etching a portion of the substrate and a portion of the dielectric structure to expose the metal ring, and then removing another portion of the dielectric structure using the metal ring as an etching mask.

Figure 1:
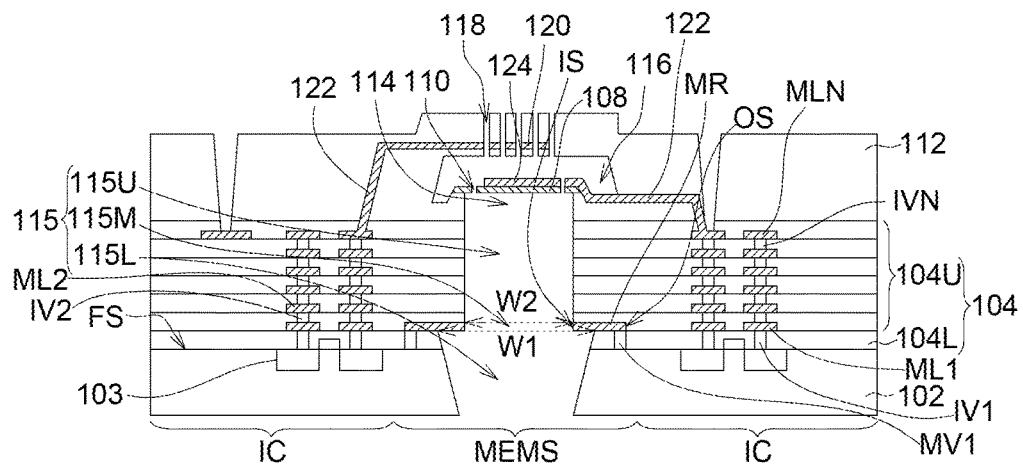
FIG. 1 illustrates a cross-section view of a semiconductor structure according to an embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

A semiconductor structure and a manufacturing method for the semiconductor structure are disclosed. In embodiments, the semiconductor structure has a metal ring in a micro-electro-mechanical system (MEMS) region. The metal ring is formed to achieve an expected pattern with an expected arrangement precisely. Therefore, a cavity formed by a removing step using the metal ring as an etching mask can align with a sensing membrane. Using the metal ring can enlarge an etching process window and increase a product yield.

Embodiments are provided hereinafter with reference to the accompanying drawings for describing the related procedures and configurations. It is noted that not all embodiments of the invention are shown. The identical and/or similar elements of the embodiments are designated with the same and/or similar reference numerals. Also, it is noted that there may be other embodiments of the present disclosure which are not specifically illustrated. Modifications and variations can be made without departing from the spirit of the disclosure to meet the requirements of the practical applications. It is also important to point out that the illustrations may not be necessarily be drawn to scale. Thus, the specification and the drawings are to be regard as an illustrative sense rather than a restrictive sense.

FIG. 1 illustrates a cross-section view of a semiconductor structure according to an embodiment. The semiconductor structure may comprise a substrate 102, a dielectric structure 104, a metal ring MR and a sensing membrane 108.

The substrate 102 may be a semiconductor substrate, for example comprising a silicon substrate, etc. The substrate 102 has a front surface FS on which an integrated circuit (IC) device 103 and other elements electrically connected to the IC device 103 may be formed by a semiconductor process for example comprising a doping step, a deposition step, a lithography step, etc. The IC device 103 is not limited to a MOS device as shown in FIG. 1, and may comprise other kinds of active and/or passive devices, such as a CMOS in an ASIC region, etc.

The dielectric structure 104 may comprise a lower dielectric portion 104L and an upper dielectric portion 104U. The lower dielectric portion 104L may be formed on the front surface FS of the substrate 102. The metal ring MR is formed on the lower dielectric portion 104L in a MEMS region. For example, the metal ring MR may comprise a metal such as Au, Cu, Al, W, Ti, Ta, etc., and/or a nitride of the metal, and/or an alloy thereof, etc. The upper dielectric portion 104U may be formed on the metal ring MR and the lower dielectric portion 104L. The lower dielectric portion 104L and the upper dielectric portion 104U may comprise an interlayer dielectric (ILD) film and/or an inter-metal dielectric (IMD) film. The lower dielectric portion 104L and the upper dielectric portion 104U may comprise an oxide and/or a nitride, such as silicon oxide, silicon nitride, silicon oxynitride, or other suitable dielectric structures/dielectric materials. The metal ring MR may be formed with a damascene process or a metal etching process.

The sensing membrane 108 is in the MEMS region. The sensing membrane 108 may have a hole 110 communicating with an opening 114 in an insulating layer 112 and a cavity 115 below the sensing membrane 108, and communicating with an empty space 116 and an aperture 118 in the insulating layer 112 above the sensing membrane 108. The aperture 118 may be also defined by a conductive pattern 120. In embodiments, the MEMS region comprises a microphone, and the sensing membrane 108 is functioned as a diaphragm for the microphone.

The cavity 115 may comprise a lower cavity portion 115L defined by the substrate 102 and the lower dielectric portion 104L, a medium cavity portion 115M defined by the metal ring MR, and an upper cavity portion 115U defined by the upper dielectric portion 104U.

In embodiments, the lower cavity portion 115L widens gradually along a direction toward the metal ring MR. In addition, the lower cavity portion 115L has a width larger than a width of the upper cavity portion 115U. For example, as shown in FIG. 1, the lower cavity portion 115L has a first width W1. For example, the first width W1 may be defined by a boundary line between a sidewall surface of the lower dielectric portion 104L and a lower surface of the metal ring MR. The upper cavity portion 115U has a second width W2. For example, the second width W2 may be defined by a boundary line between a sidewall surface of the upper dielectric portion 104U and a sidewall surface of the metal ring MR. The first width W1 is larger than the second width W2. In an embodiment, the second width W2 of the upper cavity portion 115U is a substantial uniform width. In other words, the upper cavity portion 115U has a constant width.

Figure 2:
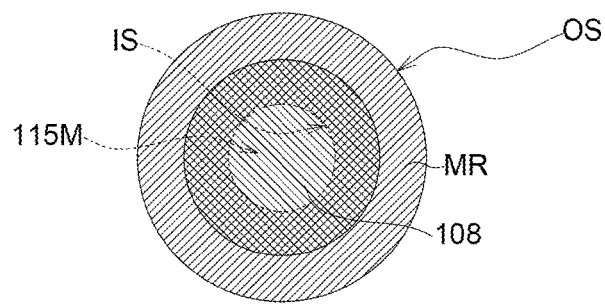
FIG. 2 illustrates a top view of a sensing membrane and a metal ring according to an embodiment.

In embodiments, the sensing membrane 108 is corresponded with (or overlapped with) the cavity 115. For example, FIG. 2 shows a top view for illustrating the sensing membrane 108 and the metal ring MR, wherein the sensing membrane 108 and the metal ring MR are indicated with oblique lines of different extending directions, and an overlap between the sensing membrane 108 and the metal ring MR is indicated with a crisscross portion of the oblique lines. In an embodiment, the metal ring MR has a circular ring shape having a circular (inner) sidewall surface IS and a circular (outer) sidewall surface OS. The medium cavity portion 115M of the cavity 115 is defined by the (inner) sidewall surface IS of the metal ring MR. The medium cavity portion 115M of the cavity 115 may be aligned with the sensing membrane 108 substantially. For example, a center of the medium cavity portion 115M may be aligned with a center of the sensing membrane 108 substantially. The present disclosure is not limited to the forgoing. In other embodiments, for example, the metal ring MR may have a square ring shape, a rectangle ring shape, an oval ring shape, an arbitrary polygonal ring shapes, or other arbitrary various shapes. Furthermore, the inner sidewall surface IS and the outer sidewall surface OS may have different shapes. For example, the inner sidewall surface IS may be circular to define the medium cavity portion 115M of the cavity 115 while the outer sidewall surface OS may be non-circular.

Referring to FIG. 1, a conductive via MV1 may be formed in the lower dielectric portion 104L in the MEMS region. The conductive via MV1 electrically connected to the metal ring MR may be electrically connected to a ground for avoiding generating a parasitic capacitance.

A conductive via IV1 may be formed in the lower dielectric portion 104L in an integrated circuit (IC) region adjacent to the MEMS region. Conductive layers ML1, ML2 to MLN and conductive vias IV2 to IVN may be disposed in different levels in the upper dielectric portion 104U in the IC region. For example, the conductive layers ML1, ML2 to MLN may be a first ($1^{st}$) metal layer (Metal 1), a second ($2^{nd}$) metal layer (Metal 2) to an $N^{th}$ metal layer in sequence, wherein N is a positive integer, and so forth.

In embodiments, the metal ring MR is in a level same as one of the conductive layers ML1-MLN. For example, the metal ring MR is in a level same as the conductive layer ML1. The conductive layer ML1 may be the first metal layer (Metal 1).

A conductive element 122 may be formed in the insulating layer 112. For example, the conductive element 122 may be electrically connected to a conductive film 124 above the sensing membrane 108 and/or the conductive pattern 120, and may be electrically connected to the IC device 103 through the conductive layers ML1-MLN and the conductive vias IV1-IVN.

Figure 3:
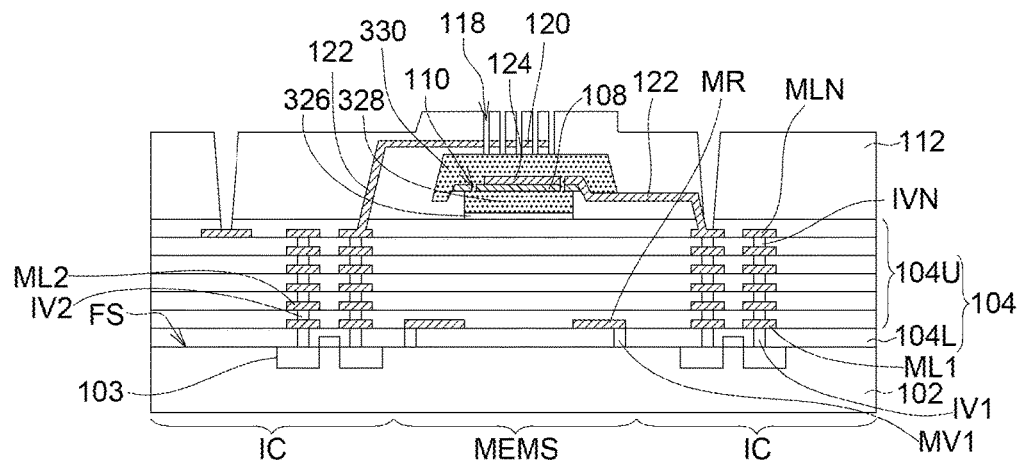
FIG. 3 to FIG. 4 illustrate a manufacturing method for a semiconductor structure according to an embodiment.
Figure 4:
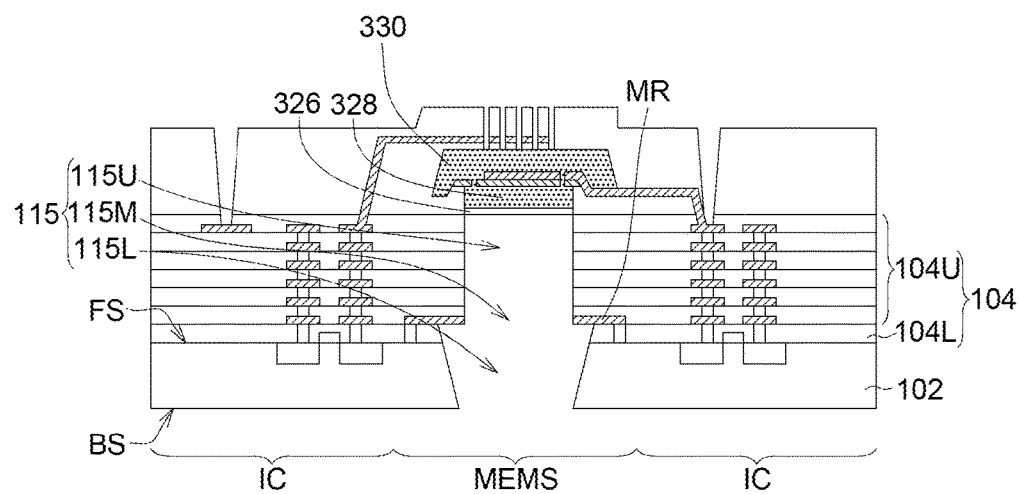

FIG. 3 to FIG. 4 illustrate a manufacturing method for a semiconductor structure according to an embodiment.

Firstly, a structure as shown in FIG. 3 is provided. As shown in FIG. 3, the IC device 103 is formed on the front surface FS of the substrate 102 in the IC region. The lower dielectric portion 104L is formed on the front surface FS of the substrate 102 and the IC device 103. The conductive via MV1 is formed in the lower dielectric portion 104L in the MEMS region. The conductive via IV1 is formed in the lower dielectric portion 104L in the IC region. In an embodiment, the conductive via MV1 and the conductive via IV1 may be formed simultaneously with the same process. In other words, the conductive via MV1 in the MEMS region may be formed with materials and processes applied for forming an element in the IC region simultaneously. Therefore, additional material and process are not needed for the conductive via MV1 in the MEMS region. A forming method is simple and cost is low for the conductive via MV1. In other embodiments, the conductive via MV1 and the conductive via IV1 may be formed individually.

Referring to FIG. 3, the metal ring MR is formed on the lower dielectric portion 104L in the MEMS region. The conductive layer ML1 is formed on the lower dielectric portion 104L in the IC region. In an embodiment, the metal ring MR and the conductive layer ML1 may be in the same level, and may be formed by the same process simultaneously. In other words, the metal ring MR in the MEMS region may be formed with materials and processes applied for forming an element in the IC region simultaneously. Therefore, additional material and process are not needed for the metal ring MR in the MEMS region. A forming method is simple and cost is low for the metal ring MR. In other embodiments, the metal ring MR and the conductive layer ML1 may be formed individually.

The upper dielectric portion 104U, the conductive layers ML2-MLN and the conductive vias IV2-IVN are formed on the lower dielectric portion 104L, the metal ring MR and the conductive layer ML1. In an embodiment, for example, the conductive layers ML2-MLN and the conductive vias IV2-IVN are formed in the upper dielectric portion 104U in the IC region, and may be electrically connected to the IC device 103 through the conductive layer ML1 and the conductive via IV1.

Referring to FIG. 3, an etching stop layer 326 may be formed on the upper dielectric portion 104U in the MEMS region. In an embodiment, the etching stop layer 326 comprises amorphous silicon, but is not limited thereto. For example, the etching stop layer 326 may comprise an oxide, a nitride, etc. or other suitable materials as long as there is enough etching selectivity between the upper dielectric portion 104U and the etching stop layer 326. A sacrificial layer 328 may be formed on the etching stop layer 326. In an embodiment, for example, the sacrificial layer 328 may comprise an oxide, a nitride, etc. or other suitable materials. The sensing membrane 108 may be formed on the sacrificial layer 328. The conductive film 124 may be formed on the sensing membrane 108. The hole 110 may be formed in the sensing membrane 108 and the conductive film 124. A sacrificial layer 330 is formed on the sensing membrane 108 and the conductive film 124, and filled in the hole 110. In an embodiment, for example, the sacrificial layer 330 may comprise an oxide, a nitride, etc. or other suitable materials. The sensing membrane 108 may be formed on the sacrificial layer 328. The insulating layer 112 and the conductive pattern 120 are formed on the sacrificial layer 330. In addition, the insulating layer 112 and the conductive pattern 120 have the aperture 118 formed therein. The conductive element 122 is formed in the insulating layer 112.

Referring to FIG. 4, a photoresist pattern (not shown) is formed on a back surface BS of the substrate 102 by a lithography process. Portions of the substrate 102 and the lower dielectric portion 104L are removed by an etching step from the back surface BS of the substrate 102 with using the photoresist pattern (not shown) as an etching mask and using the metal ring MR as an etching stop layer so as to form the lower cavity portion 115L. Then the photoresist pattern is removed. Next, an etching step using the metal ring MR as an etching mask is performed to remove the upper dielectric portion 104U exposed by the medium cavity portion 115M so as to form the upper cavity portion 115U in the upper dielectric portion 104U. The etching step for forming the upper cavity portion 115U may stop on the etching stop layer 326.

In embodiments, an alignment shift problem occurs easily for an etching process applied toward the back surface BS of the substrate 102. In other words, for example, the lower cavity portion 115L formed by the etching step from the back surface BS of the substrate 102 would not align with the sensing membrane 108 accurately. The alignment shift is worse for a region near an edge of a wafer. With this concept, in some comparative examples without using the metal ring MR, a cavity (for example comprising a cavity portion (not shown) formed in the upper dielectric portion 104U in FIG. 1 and communicating with the opening 114) formed by the etching process from the back surface BS of the substrate 102 would shift from (not align accurately with) the sensing membrane 108 in a product. It would disadvantageously affect product quality, and may even result in scrap.

In embodiments according to the present disclosure, the metal ring MR is formed by the process applied toward the front surface FS of the substrate 102. Compared with a process applied toward the back surface BS of the substrate 102, the process applied toward the front surface FS of the substrate 102 has more accurate alignment ability. Therefore, the metal ring MR formed by the process applied toward the front surface FS can be controlled to have an expected pattern with an expected arrangement more easily. Specifically, the medium cavity portion 115M in the metal ring MR can align with the sensing membrane 108 precisely. Therefore, using the metal ring MR as an etching mask for the etching process removing the upper dielectric portion 104U can make the upper cavity portion 115U with an expected width and aligning with the sensing membrane 108 precisely, no matter how the process applied toward the back surface BS of the substrate 102 or the lower cavity portion 115L shifts, and no matter how wide the lower cavity portion 115L limited by the process applied toward the back surface BS of the substrate 102 is. In other words, using the metal ring MR not only can enlarge an etching process window but also can increase a product yield.

In other embodiments, during the etching process for forming the upper cavity portion 115U using the metal ring MR as an etching mask, a portion of the metal ring MR exposed by the lower cavity portion 115L may be consumed, and thus metal ring MR may have a reduced thickness compared to its as-formed thickness.

Figure 5:
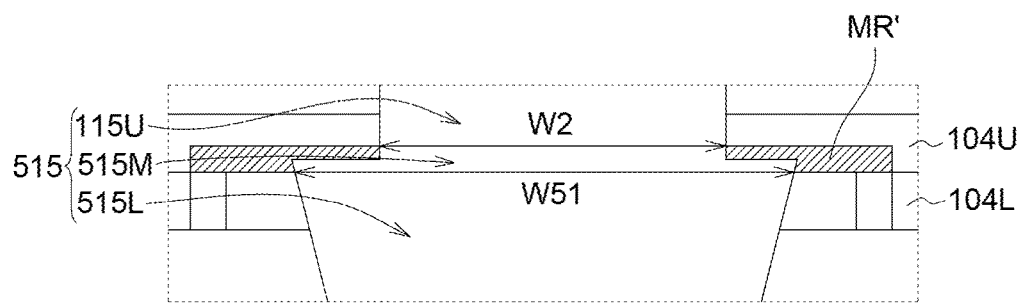
FIG. 5 illustrates an enlarged view of a metal ring and a nearby region according to an embodiment.

For example, as shown in an enlarged view of FIG. 5 illustrating the metal ring MR' and a region near the metal ring MR', a portion of the metal ring MR' exposed by a lower cavity portion 515L may be thinner than another portion of the metal ring MR' not exposed by the lower cavity portion 515L or covered by the lower dielectric portion 104L. A cavity 515 comprises the lower cavity portion 515L, the upper cavity portion 115U and a medium cavity portion 515M. The lower cavity portion 515L has a first width W51. For example, the first width W51 may be defined by a boundary line between the sidewall surface of the lower dielectric portion 104L and a sidewall surface of the metal ring MR'. The upper cavity portion 115U has the second width W2. For example, the second width W2 may be defined by a boundary line between the sidewall surface of the upper dielectric portion 104U and a sidewall surface of the metal ring MR'. Alternatively, a lower portion of the medium cavity portion 515M adjacent to the lower cavity portion 515L may have the first width W51, and an upper portion of the medium cavity portion 515M adjacent to the upper cavity portion 115U may have the second width W2. The first width W51 is larger than the second width W2.

Referring back to FIG. 4, next, the etching stop layer 326, the sacrificial layer 328 and the sacrificial layer 330 are removed to form the semiconductor structure as shown in FIG. 1.

The present disclosure is not limited to the foregoing embodiments, and may be extended to other variations according to the disclosed concepts.

Figure 6:
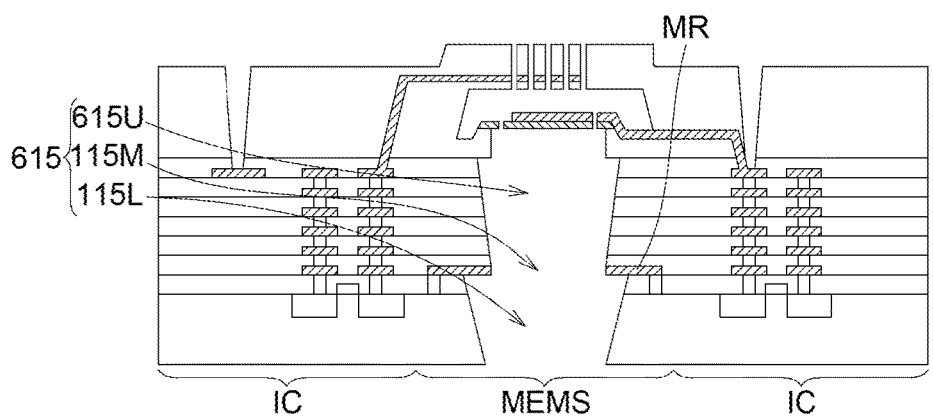
FIG. 6 illustrates a cross-section view of a semiconductor structure according to another embodiment.

For example, the semiconductor structure may have other kinds of structural arrangement according to materials and processes selected for an element. For example, a cross-section view of a semiconductor structure shown in FIG. 6 according to another embodiment is different from the semiconductor structure shown in FIG. 1 in that a cavity 615 comprising an upper cavity portion 615U widening gradually along a direction away from the metal ring MR.

Figure 7:
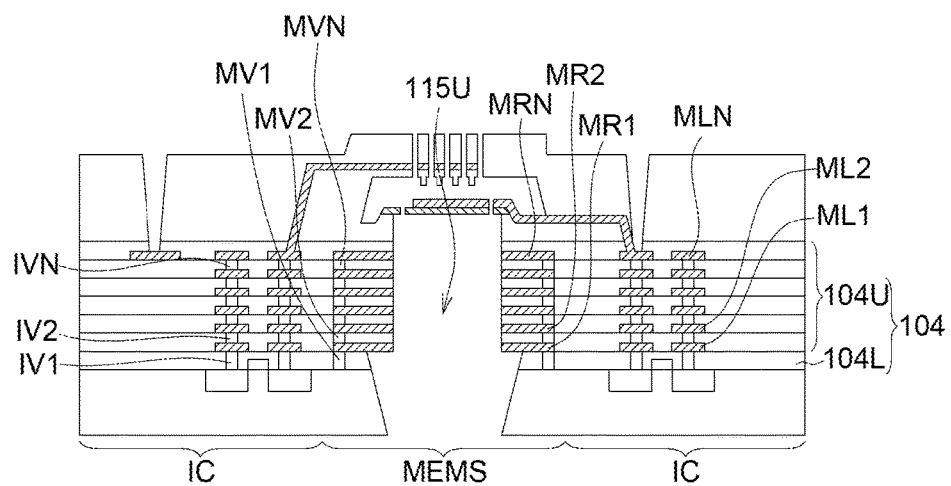
FIG. 7 illustrates a cross-section view of a semiconductor structure according to yet another embodiment.

In other embodiments, the semiconductor structure may have a plurality of metal rings in different levels. For example, a cross-section view of a semiconductor structure shown in FIG. 7 according to another embodiment is different from the semiconductor structure shown in FIG. 1 in that metal rings MR1, MR2 to MRN and conductive vias MV1, MV2 to MVN are formed in the dielectric structure 104 in the MEMS region. In embodiments, the metal rings MR1, MR2 to MRN in the MEMS region and the conductive layers ML1, ML2 to MLN in the IC region in the same levels respectively may be formed by the same process simultaneously. For example, the metal rings MR1, MR2 to MRN may comprise a metal such as Au, Cu, Al, W, Ti, Ta, etc., and/or a nitride of the metal, and/or an alloy thereof, etc., respectively. The conductive vias MV1, MV2 to MVN in the MEMS region and the corresponding conductive vias IV1, IV2 to IVN in the IC region may be formed by the same process simultaneously. The metal rings MR1, MR2 to MRN may be used as etching masks during removing the upper dielectric portion 104U to form the upper cavity portion 115U. The metal rings MR1, MR2 to MRN may be electrically connected to a ground through the conductive vias MV1, MV2 to MVN to avoid generation of parasitic capacitance.

In other embodiments, quantity and level for a metal ring or metal rings may be chosen arbitrarily. For example, only the metal ring MR2 may be used. Alternatively, only the metal ring MR1 and the metal ring MR2 may be used. Optionally, other kinds of arrangements for a metal ring or metal rings may be used. In some embodiments, at least one of the conductive vias MV1, MV2 to MVN may be omitted arbitrarily. For example, in an embodiment, all of the conductive vias MV1, MV2 to MVN in the MEMS region may be omitted.

Figure 8:
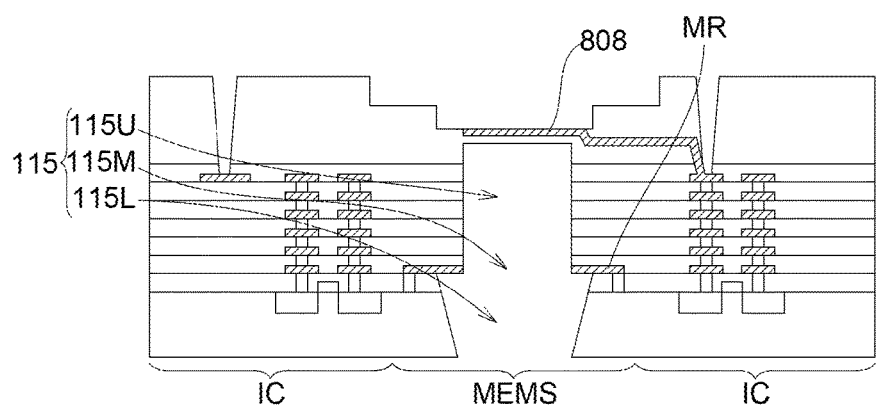
FIG. 8 illustrates a cross-section view of a semiconductor structure according to an embodiment.

In other embodiments, the concept of the metal ring may be applied for other kinds of MEMS devices. A semiconductor structure in an embodiment shown in FIG. 8 is different from the semiconductor structure shown in FIG. 1 in that the MEMS region comprises a gas sensor comprising a sensing membrane 808 functioned as a gas sensing layer. In embodiments, the cavity 115 may be formed with using the metal ring MR as an etching mask/etching stop layer to form the lower cavity portion 115L, the medium cavity portion 115M and the upper cavity portion 115U according to the method concepts disclosed referring to FIG. 3 and FIG. 4. Therefore, the cavity 115 can align with (or overlap with) the sensing membrane 808.

In the present disclosure, the upper dielectric portion (or upper cavity portion) of the dielectric structure and the lower dielectric portion (lower cavity portion) of the dielectric structure may be defined according to a position of the metal ring. Specifically, a portion of the dielectric structure removed to expose the metal ring may be regarded as the lower dielectric portion defining the lower cavity portion. In addition, another portion of the dielectric structure removed with using the metal ring as an etching mask may be regarded as the upper dielectric portion defining the upper cavity portion. For example, in other embodiments of the semiconductor structure having only the metal ring M2, a portion of the dielectric structure under a lower surface of the metal ring M2 may be regarded as the lower dielectric portion, another portion of the dielectric structure on the lower dielectric portion may be regarded as the upper dielectric portion, and so forth.

The semiconductor structure and the manufacturing method thereof according to the present disclosure can achieve at least the following advantages. The metal ring can be formed with an expected pattern and an expected arrangement precisely. Therefore, the cavity formed by the removing step using the metal ring as an etching mask can align with the sensing membrane of a MEMS device precisely. The etching process window is enlarged, and the product yield can be increased. The metal ring may be grounded so as to avoid parasitic capacitance that may disadvantageously affect a product device. The metal ring may be formed with a process for a metal layer in the IC region simultaneously and thus a forming method is simple and cost is low for the metal ring.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising a micro-electro-mechanical system (MEMS) region comprising:
    a sensing membrane;
    a metal ring defining a cavity under the sensing membrane; and
    a dielectric structure comprising an upper dielectric portion on the metal ring, wherein the cavity comprises an upper cavity portion defined by the upper dielectric portion, the upper cavity portion widens gradually along a direction away from the metal ring.

2. The semiconductor structure according claim 1, wherein the cavity comprises a medium cavity portion defined by the metal ring, the dielectric structure further comprises: a lower dielectric portion, wherein the cavity further comprises a lower cavity portion defined by the lower dielectric portion and under the medium cavity portion, the upper cavity portion defined by the upper dielectric portion is on the medium cavity portion, the lower cavity portion has a first width, the upper cavity portion has a second width, the first width is larger than the second width.

3. The semiconductor structure according claim 2, further comprising a substrate below the lower dielectric portion, wherein the lower cavity portion is further defined by the substrate, the lower cavity portion widens gradually along a direction toward the metal ring.

4. The semiconductor structure according claim 1, wherein the metal ring is grounded.

5. The semiconductor structure according claim 1, further comprising conductive layers in different levels in an integrated circuit (IC) region adjacent to the MEMS region, wherein the metal ring and one of the conductive layers are in the same level.

6. The semiconductor structure according claim 5, wherein the one of the conductive layers is a first metal layer (Metal 1).

7. The semiconductor structure according claim 1, comprising a plurality of the metal rings in different levels in the MEMS region.

8. The semiconductor structure according claim 6, further comprising conductive layers in different levels in an IC region adjacent to the MEMS region, wherein the conductive layers and the metal rings are in the same levels.

9. The semiconductor structure according claim 1, wherein the sensing membrane is functioned as a diaphragm for a microphone or functioned as a gas sensing layer for a gas sensor.

10. A semiconductor structure, comprising:
    a substrate;
    a lower dielectric portion on the substrate;
    a metal ring on the lower dielectric portion;
    an upper dielectric portion on the metal ring; and
    a cavity exposing a sidewall surface of the substrate, a sidewall surface of the lower dielectric portion, a sidewall surface of the metal ring and a sidewall surface of the upper dielectric portion in a MEMS region.

11. The semiconductor structure according claim 10, wherein the cavity further exposes a lower surface of the metal ring.

12. The semiconductor structure according claim 10, wherein the cavity comprises a lower cavity portion and an upper cavity portion, the lower cavity portion is defined by the substrate and the lower dielectric portion, the upper cavity portion is defined by the upper dielectric portion, the lower cavity portion is wider than the upper cavity portion.

13. The semiconductor structure according claim 10, wherein the MEMS region comprises a microphone or a gas sensor.

14. The semiconductor structure according claim 10, further comprising a sensing membrane overlapping with the cavity in the MEMS region.

* * * * *